(12) United States Patent
Carter, Jr. et al.

(10) Patent No.: US 6,639,247 B2
(45) Date of Patent: Oct. 28, 2003

(54) SEMI-INSULATING SILICON CARBIDE WITHOUT VANADIUM DOMINATION

(75) Inventors: Calvin H. Carter, Jr., Cary, NC (US); Mark Brady, Carrboro, NC (US); Valeri F. Tsvetkov, Durham, NC (US)

(73) Assignee: Cree, Inc., Durham, NC (US)

(*) Notice: Subject to any disclaimer, the term of this patent is extended or adjusted under 35 U.S.C. 154(b) by 5 days.

(21) Appl. No.: 09/810,830

(22) Filed: Mar. 16, 2001

(65) Prior Publication Data

US 2001/0017374 A1 Aug. 30, 2001

Related U.S. Application Data

(63) Continuation of application No. 09/313,802, filed on May 18, 1999, now Pat. No. 6,218,680.

(51) Int. Cl.$^7$ ............................................. H01L 31/0312
(52) U.S. Cl. ........................................... 257/77; 257/78
(58) Field of Search .......................... 257/77, 76, 78; 438/285, 483, 518, 602, 604

(56) References Cited

U.S. PATENT DOCUMENTS

| | | | |
|---|---|---|---|
| 4,897,710 A | | 1/1990 | Suzuki et al. |
| 5,184,199 A | * | 2/1993 | Fujii et al. |
| 5,270,554 A | * | 12/1993 | Palmour |
| 5,336,520 A | | 8/1994 | Hoenig |
| 5,505,929 A | | 4/1996 | Matsumoto et al. |
| 5,510,630 A | | 4/1996 | Agarwal et al. |
| 5,611,955 A | * | 3/1997 | Barrett et al. |
| 5,641,975 A | | 6/1997 | Agarwal et al. |
| 5,686,737 A | | 11/1997 | Allen |
| 5,705,139 A | | 1/1998 | Stiller et al. |
| 5,719,409 A | | 2/1998 | Singh et al. |
| 5,741,615 A | | 4/1998 | Saitoh et al. |
| 5,773,151 A | | 6/1998 | Begley et al. |
| 5,831,288 A | | 11/1998 | Singh et al. |
| 5,907,188 A | | 5/1999 | Nakajima et al. |
| 6,218,680 B1 | | 4/2001 | Carter, Jr. et al. |
| 6,403,982 B2 | * | 6/2002 | Carter, Jr. et al. |

FOREIGN PATENT DOCUMENTS

| | | |
|---|---|---|
| EP | 0750789 B1 | 4/1999 |
| JP | 08139048 A | 5/1996 |
| JP | 10067600 A | 3/1998 |
| WO | WO 95/04171 A1 | 2/1995 |
| WO | WO 97/02598 A | 1/1997 |
| WO | WO 00/71787 A2 | 11/2000 |

OTHER PUBLICATIONS

Schneider, J., et al., "Infrared spectra and electron spin resonance of vanadium deep level impurities in silicon carbide," Appl. Phys. Lett. 56 (12), Mar. 19, 1990, pp. 1184–1186.

Hobgood, H.M., et al., "Large diameter 6H–SiC for microwave device applications," Journal of Crystal Growth 137 (1994), pp. 181–186.

Evwaraye, A.O., et al., "Examination of electrical and optical properties of vanadium in bulk n–type silicon carbide," J.Appl. Phys. 76(10), Nov. 15, 1994, pp. 5769–5772.

(List continued on next page.)

*Primary Examiner*—Sheila V. Clark
(74) *Attorney, Agent, or Firm*—Summa & Allan, P.A.

(57) ABSTRACT

A semi-insulating bulk single crystal of silicon carbide is disclosed that has a resistivity of at least 5000 Ω-cm at room temperature and a concentration of deep level trapping elements that is below the amounts that will affect the resistivity of the crystal, preferably below detectable levels. A method of forming the crystal is also disclosed, along with some resulting devices that take advantage of the microwave frequency capabilities of devices formed using substrates according to the invention.

5 Claims, 11 Drawing Sheets

OTHER PUBLICATIONS

Sriram, S., et al., "RF Performance of SiC MESFET's on High Resistivity Substrates," IEEE Electron Device Letters, vol. 15, No. 11, Nov. 1994, pp. 458–459.

Hobgood, H.M., et al., "Semi–insulating 6H–SiC grown by physical vapor transport," Appl. Phys. Lett., vol. 66, No. 11, Mar. 13, 1995, pp. 1364–1366.

Tsvetkov, V.F., et al., "Recent progress in SiC crystal growth," presented at ICSCRM 95, Kyoto, Japan, Sep. 18, 1995, 6 pages.

Allen, S.T., et al., "Frequency and power performance of microwave SiC FET's" Proceedings of International Conference on Silicon Carbide and Related Materials, Institute of Physics, presented Sep. 21, 1995, 4 pages.

Mitchel, W.C., et al., "The 1.1 eV Deep Level in 4H–SiC," SIMC–X, Berkeley, CA, Jan. 1998, 4 pages.

Barrett, D.L., et al., "Growth of Large SiC Single Crystals"; Journal of Crystal Growth, NL, North–Holland Publishing Co. Amsterdam, vol. 128, No. 1/04, Mar. 1, 1993, pp. 358–362.

* cited by examiner

SEMI-INSULATING SILICON CARBIDE WITHOUT VANADIUM DOMINATION

CROSS-REFERENCE TO RELATED APPLICATION

This application is a continuation of U.S. application Ser. No. 09/313,802, filed May 18, 1999 U.S. Pat. No. 6,218,680.

The present invention relates to the growth of high quality silicon carbide crystals for specific purposes, and in particular relates to the production of high quality semi-insulating silicon carbide substrates that are useful in microwave devices. This invention was made under Department of the Air Force Contract Number F33615-95-C-5426. The government may have certain rights in this invention.

FIELD OF THE INVENTION

BACKGROUND OF THE INVENTION

The term "microwaves" refers to electromagnetic energy in frequencies covering the range of about 0.1 gigahertz (GHz) to 1,000 GHz with corresponding wavelengths from about 300 centimeters to about 0.3 millimeters. Although "microwaves" are perhaps most widely associated by the layperson with cooking devices, those persons familiar with electronic devices recognize that the microwave frequencies are used for a large variety of electronic purposes and in corresponding electronic devices, including various communication devices, and the associated circuit elements and circuits that operate them. As is the case with many other semiconductor electronic devices and resulting circuits, the ability of a device (or circuit) to exhibit certain desired or necessary performance characteristics depends to a large extent, and often entirely, upon the material from which it is made. One appropriate candidate material for microwave devices is silicon carbide, which offers a primary advantage for microwave applications of a very high electric breakdown field. This characteristic of silicon carbide enables devices such as metal semiconductor field effect transistors (MESFETs) to operate at drain voltages ten times higher than field effect transistors formed in gallium arsenide (GaAs).

Additionally, silicon carbide has the significant advantage of a thermal conductivity of 4.9 watts per degree Kelvin per centimeter (W/K-cm) which is 3.3 times higher than silicon and ten times higher than either gallium arsenide or sapphire. These properties give silicon carbide a high power density in terms of gate periphery measured in terms of watts per millimeter (W/mm) and also an extremely high power handling capability in terms of die area (W/mm). This is particularly advantageous for high power, high frequency applications because die size becomes limited by wavelength. Accordingly, because of the excellent thermal and electronic properties of silicon carbide, at any given frequency, silicon carbide MESFETs should be capable of at least five times the power of devices made from gallium arsenide.

As recognized by those familiar with microwave devices, they often require high resistivity ("semi-insulating") substrates for coupling purposes because conductive substrates tend to cause significant problems at microwave frequencies. As used herein, the terms "high resistivity" and "semi-insulating" can be considered synonymous for most purposes. In general, both terms describe a semiconductor material having a resistivity greater than about 1500 ohm-centimeters ($\Omega$-cm).

Such microwave devices are particularly important for monolithic microwave integrated circuits (MMICs) which are widely used in communications devices such as pagers and cellular phones, and which generally require a high resistivity substrate. Accordingly, the following characteristics are desirable for microwave device substrates: A high crystalline quality suitable for highly complex, high performance circuit elements, good thermal conductivity, good electrical isolation between devices and to the substrate, low resistive loss characteristics, low cross-talk characteristics, and large wafer diameter.

Given silicon carbide's wide bandgap (3.2 eV in 4H silicon carbide at 300K), such semi-insulating characteristics should be theoretically possible. As one result, an appropriate high resistivity silicon carbide substrate would permit both power and passive devices to be placed on the same integrated circuit ("chip") thus decreasing the size of the device while increasing its efficiency and performance. Silicon carbide also provides other favorable qualities, including the capacity to operate at high temperatures without physical, chemical, or electrical breakdown.

As those familiar with silicon carbide are aware, however, silicon carbide grown by most techniques is generally too conductive for these purposes. In particular, the nominal or unintentional nitrogen concentration in silicon carbide tends to be high enough in sublimation grown crystals ($1$–$2 \times 10^{17}$ $cm^{-3}$) to provide sufficient conductivity to prevent such silicon carbide from being used in microwave devices.

Some recent efforts have attempted to compensate the effective level of nitrogen by adding a p-type (i.e., acceptor) dopant such as boron. In practice, however, SiC-based devices made using boron to obtain high resistivity have exhibited unexpectedly poor results at high power levels. Additionally, in comparison to some other elements, boron tends to diffuse relatively well in SiC, giving it an undesirable tendency to migrate into adjacent device layers and unintentionally affect them.

In order to be particularly useful, silicon carbide devices should have a substrate resistivity of at least 1500 ohm-centimeters ($\Omega$-cm) in order to achieve RF passive behavior. Furthermore, resistivities of 5000 $\Omega$-cm or better are needed to minimize device transmission line losses to an acceptable level of 0.1 dB/cm or less. For device isolation and to minimize backgating effects, the resistivity of semi-insulating silicon carbide should approach a range of 50,000 $\Omega$-cm or higher. Present work tends to assert that the semi-insulating behavior of a silicon carbide substrate is the result of energy levels deep within the band gap of the silicon carbide; i.e., farther from both the valence band and the conduction band than the energy levels created by p-type and n-type dopants. These "deep" energy levels are believed to consist of states lying at least 300 meV away from the conduction or valence band edges, e.g., U.S. Pat. No. 5,611,955 which is representative of current conventional thinking in this art. According to the '955 patent, the deep levels in the silicon carbide between the valence and conduction bands can be produced by the controlled introduction of selected elements such as transition metals or passivating elements such as hydrogen, chlorine or fluorine, or combinations of these elements into the silicon carbide to form the deep level centers in the silicon carbide; e.g., column 3, lines 37–53. See also, Mitchel, *The 1.1 eV Deep Level in 4H—SiC*. SIMC-X, Berkley Calif., June 1998; Hobgood, *Semi-Insulating GH—SiC Grown by Physical Vapor Transport*, Appl. Phys. Lett. Vol. 66, No. 11 (1995); WO 95/04171; Sriram, *RF Performance of SiC MESFETs on High Resistivity Substrates*, IEEE Electron Device Letters, Vol. 15, No. 11 (1994); Evwaraye, *Examination of Electrical and Optical Properties of Vanadium in Bulk n-type Silicon Carbide*, J.Appl. Phys. 76 (10) (1994); Schneider, *Infrared Spectra and Electron Spin Resonance of Vanadium Deep Level Impurities in Silicon Carbide*, Appl. Phys. Lett. 56(12) (1990); and Allen, *Frequency and Power Performance of Microwave SiC FET's*, Proceedings of International Conference on Silicon Carbide and Related Materials 1995, Institute of Physics.

Further to the conventional thinking, these deep level elemental impurities (also known as deep level trapping elements) can be incorporated by introducing them during high temperature sublimation or chemical vapor deposition (CVD) growth of high purity silicon carbide. In particular, vanadium is considered a desirable transition metal for this purpose. According to the '955 patent and similar art, the vanadium compensates the silicon carbide material and produces the high resistivity (i.e., semi-insulating) characteristics of silicon carbide.

The introduction of vanadium as a compensating element to produce semi-insulating silicon carbide, however, also introduces certain disadvantages. First, the presence of electronically significant amounts of any dopant, including vanadium, can negatively affect the crystalline quality of the resulting material. Accordingly, to the extent that vanadium or other elements can be significantly reduced or eliminated, the crystal quality of the resulting material, and its corresponding electronic quality, can be increased. In particular, the present understanding is that compensating amounts of vanadium can cause growth defects such as inclusions and micropipes in silicon carbide.

As a second disadvantage, the introduction of compensating amounts of vanadium can reduce the yield and add expense to the production of semi-insulating silicon carbide substrates. Third, the proactive compensation of silicon carbide, or any other semiconductor element, can be somewhat complex and unpredictable and thus introduces manufacturing complexity that can be desirably avoided if the compensation can be avoided.

OBJECT AND SUMMARY OF THE INVENTION

Therefore, it is an object of the present invention to provide a semi-insulating silicon carbide substrate that offers the capabilities that are required and advantageous for high frequency operation, but while avoiding the disadvantages of prior materials and techniques.

The invention meets this object with a semi-insulating bulk single crystal of silicon carbide having a resistivity of at least 5000 Ω-cm at room temperature and a concentration of deep level trapping elements that is below detectable levels or that does not affect the electronic properties of the material.

In another aspect, the invention is a method of producing a semi-insulating bulk single crystal of silicon carbide. The method comprises heating a silicon carbide source powder to sublimation while heating and then maintaining a silicon carbide seed crystal to a temperature below the temperature of the source powder at which temperature sublimed species from the source powder will condense upon the seed crystal; and continuing to heat the silicon carbide source powder until a desired amount of single crystal bulk growth has occurred upon the seed crystal. The method is characterized in that the amounts of deep level trapping elements in the source powder are below detectable levels; and in that during sublimation growth, the source powder and the seed crystal are maintained at respective temperatures high enough to significantly reduce the amount of nitrogen that would otherwise be incorporated into the bulk growth on the seed crystal and to increase the number of point defects in the bulk growth to an amount that renders the resulting silicon carbide bulk single crystal semi-insulating.

In yet another aspect, the invention comprises devices that incorporate the semi-insulating silicon carbide according to the claimed invention, including MESFETs, certain MOSFETs, and HEMTs (High Electron Mobility Transistors).

The foregoing and other objects and advantages of the invention and the manner in which the same are accomplished will become clearer based on the following detailed description taken in conjunction with the accompanying drawings in which:

DETAILED DESCRIPTION

Figure 1:
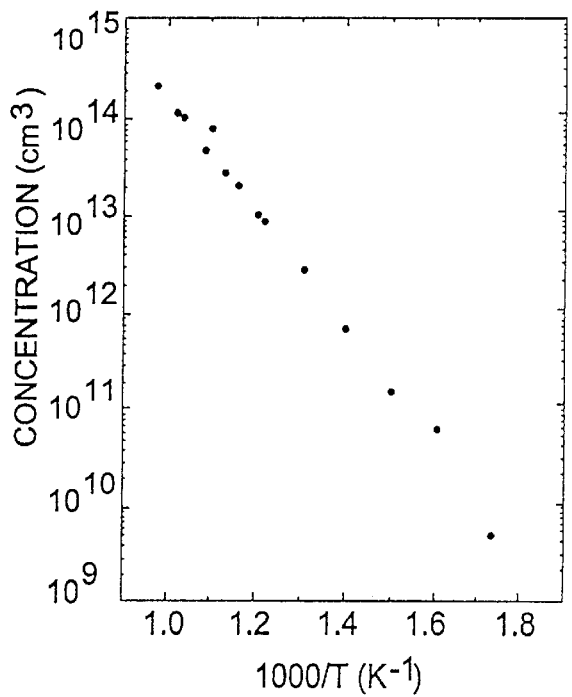
FIGS. 1 through 3 are the plots of the Hall effect measurements carried out on wafers made according to the present invention.

In a first embodiment, the invention is a semi-insulating bulk single crystal of silicon carbide having concentration of deep level trapping elements that is below a level at which such elements dominate the resistivity of the crystal and preferably at a concentration that is below detectable levels.

As used herein the term "deep level trapping element" refers to those elements from the periodic table which, when incorporated as dopants in silicon carbide form states at levels between the valence and conduction bands of silicon carbide that are much farther removed (i.e., at least 300 MeV) from both the conduction and valence bands than are more conventional p-type or n-type dopants. As set forth in the Field and Background, common deep level trapping elements include vanadium and other transition metals.

As further used herein, the concentration that is defined as "below detectable levels," refers to elements that are present in amounts that cannot be detected by modern sophisticated analytical techniques. In particular, because one of the more common techniques for detecting elements in small amounts is secondary ion mass spectroscopy ("SIMS"), the detectable limits referred to herein are those amounts of elements such as vanadium and other transition metals that are present in amounts of less than $1\times10^{16}$ cm$^{-3}$ (1E16), or in other cases, less than about 1E14. These two amounts represent typical detection limits for most trace elements (particularly vanadium) using SIMS techniques; e.g., SIMS Theory— Sensitivity and Detection Limits, Charles Evans & Associates (1995), www.cea.com.

As noted above, vanadium (V) is one of the more common elements for producing deep level traps in silicon carbide. Accordingly, the invention is characterized in that vanadium is either absent, or if present, is present in amounts below those which will substantially affect the resistivity of the crystal, and preferably below the amount that can be detected by SIMS.

Although other polytypes (i.e., crystal structures) are possible, the silicon carbide single crystal according to this embodiment of the invention preferably has a polytype selected from the group consisting of the 3C, 4H, 6H and 15R polytypes.

Furthermore, in order to avoid the problems associated with the presence of nitrogen, and the resulting necessity to attempt to compensate for the nitrogen, silicon carbide single crystals according to this embodiment of the invention preferably have a concentration of nitrogen atoms below about $1\times10^{17}$ cm$^{-3}$ (1E17). More preferably, the silicon carbide semi-insulating single crystal according to the present invention will have a concentration of nitrogen of 5E16 or less. Because the concentration of vanadium is below the level that affects the electrical characteristics of the crystal, and preferably less than can be detected by secondary ion mass spectroscopy, the concentration of vanadium is accordingly less than 1E16 atoms per cubic centimeter, and most preferably less than 1E14 atoms per cubic centimeter. Additionally, the resulting bulk silicon carbide single crystal will preferably have a resistivity of at least 10,000 Ω-cm at room temperature, and most preferably a resistivity of at least 50,000 Ω-cm at room temperature.

For purposes of providing semi-insulating silicon carbide substrates for high frequency MESFETs, the 4H polytype is preferred for, its higher bulk electron mobility. For other devices, the other polytypes may be preferred. Accordingly, one of the more preferred embodiments of the invention is a semi-insulating bulk single crystal of 4H silicon carbide that has a resistivity of at least 10,000 Ω-cm at room temperature and concentration of vanadium atoms of less than 1E14.

In another embodiment, the invention comprises a method of producing a semi-insulating bulk single crystal of silicon carbide. In this embodiment, the method comprises heating a silicon carbide source powder to sublimation while, heating and then maintaining a silicon carbide seed crystal to a temperature below the temperature of the source powder, and at which temperature sublimed species from the source powder will condense upon the seed crystal. Thereafter, the method includes continuing to heat the silicon carbide source powder until a desired amount of single crystal bulk growth has occurred upon the seed crystal. The method is characterized in that (1) the amounts of deep level trapping elements in the source powder (as described above) are below the relevant amounts, (2) the source powder contains 5E16 or less nitrogen, and (3) during sublimation growth, the source powder and the seed crystal are maintained at respective temperatures high enough to significantly reduce the amount of nitrogen that would otherwise be incorporated into the bulk growth on the seed crystal and to increase the number of point defects (sometimes referred to as intrinsic point defects) in the bulk growth on the seed crystal to an amount that renders the resulting silicon carbide bulk single crystal semi-insulating. Preferably and conceptually, by keeping the amounts of nitrogen or other dopants as low as possible, the number of point defects required to make the crystal semi-insulating can also be minimized. Presently, the preferred number of point defects appears to be in the range of 1E15–5E17.

Although the inventors do not wish to be bound by any particular theory, the resulting deep traps in the silicon carbide that render it semi-insulating appear to result from vacancies, interstitials or other intrinsic point defects rather than the presence of vanadium, other transition metals, or other elements. In order to produce the semi-insulating silicon carbide according to the invention, the source powder that is used must be free of vanadium, or if vanadium is present, it must be below detectable levels. As noted above, the detectable levels are typically characterized as those that can be measured using SIMS. Stated differently, the amount of vanadium in the source powder is preferably less than 1E16 atoms per cubic centimeter, and most preferably less than 1E14 atoms per cubic centimeter.

It has been further discovered according to the present invention that the amount of nitrogen in the resulting bulk single crystal can be reduced, not only by using the high purity techniques referred to in the prior art (which are certainly acceptable as part of the inventive technique), but also by carrying out the sublimation at relatively higher temperatures, while keeping the temperature of the seed crystal, and any bulk growth on the seed crystal at a temperature below the temperature of the source powder. A preferred technique for sublimation growth (other than as modified as described herein) is set forth in U.S. Pat. No. RE 34,861, the contents of which are incorporated entirely herein by reference ("the '861 patent").

The sublimation is carried out in an appropriate crucible that, as set forth in the '861 patent, is typically formed of graphite. The crucible includes a seed holder, and both are positioned inside of a sublimation furnace. In the method of the present invention, the SiC source powder is selected and purified as necessary to have a nitrogen concentration of less than about 1E17 and preferably less than about 5E16. Furthermore, the source powder has a concentration of vanadium, or other heavy metals or transition elements, that is below the amount that would affect the electrical characteristics of the resulting crystal. Such amounts include those below SIMS-detectable levels, meaning that using currently available SIMS, they are at least below 1E16 and preferably below 1E14 atoms per cubic centimeter. The source powder also preferably meets the other advantageous characteristics set forth in the '861 patent.

From a practical standpoint, silicon carbide sublimation can be carried out with source temperatures ranging from about 2100° C. to 2500° C. with the temperature of the seed crystal being kept proportionally lower. For the materials described herein, the source was kept at between about 2360 and 2380° C. with the seed being 300–350° C. lower. As known to those familiar with such procedures and measurements, the indicated temperatures can depend on how and where the system is measured and may differ slightly from system to system.

Because vanadium has been the deep level trapping element of choice for prior attempts to produce compensated-type semi-insulating silicon carbide, the invention can be expressed as the bulk SiC single crystal, and the method of making it, in which vanadium is below the detectable and numerical levels recited above. It will be understood, however, by those familiar with the growth of silicon carbide and the characteristics of silicon carbide as used for semiconductor purposes, however, that the invention likewise contemplates the absence of any other elements which would produce deep level traps.

By avoiding the use of elements to create the deep level traps, the invention likewise eliminates the need to compensate the trapping elements with other elements and correspondingly reduces the complications that such compensation introduces into the crystal growth processes.

FIGS. 1 through 17 illustrate various measurements carried out on the semi-insulating substrates according to the present invention, along with some comparisons with more conventional compensated and uncompensated silicon carbide material.

Figure 2:
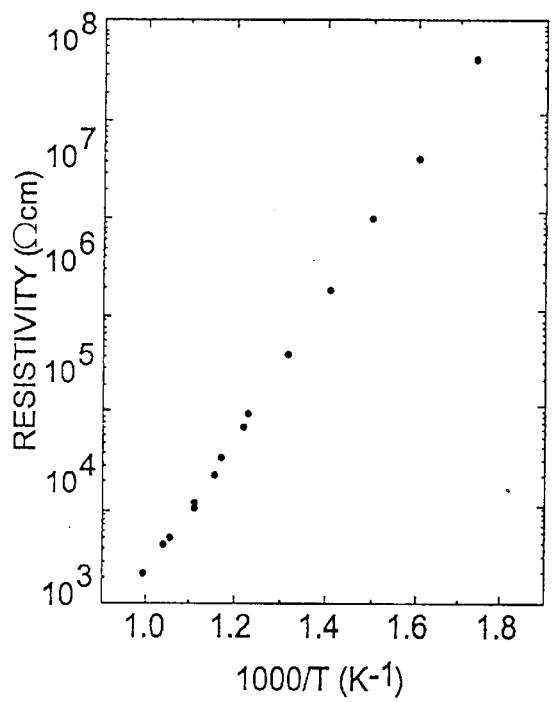
Figure 3:
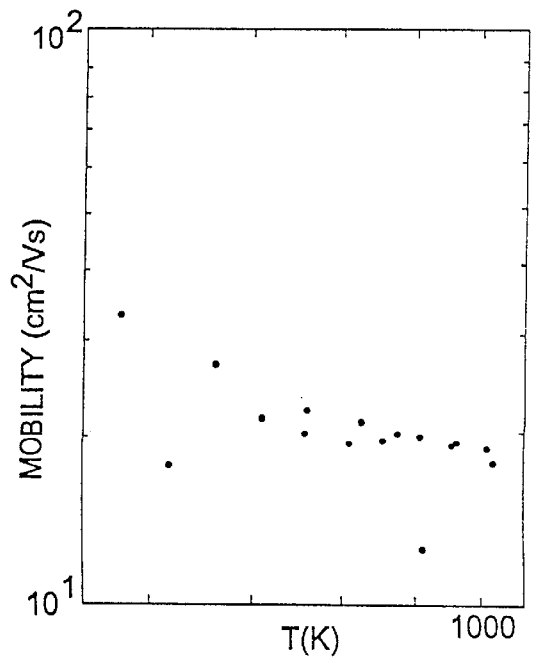

FIGS. 1 through 3 represent a corresponding set of measurements taken on a substrate wafer grown at Cree Research Inc., Durham, North Carolina, in accordance with the present invention. As set forth in the "Experimental" portion herein, the characteristics of these materials were tested by the Air Force Research Laboratory in Dayton, Ohio. FIG. 1 plots the carrier concentration as against reciprocal temperature (with the concentration being on a logarithmic scale) for a semi-insulating substrate wafer according to the present invention. The slope of the resulting line gives the activation energy which is approximately 1.1 electron volts (eV).

FIG. 2 shows that the resistivity increases as the temperature decreases in a manner consistent with the other expected properties of the semi-insulating material according to the present invention.

FIG. 3 represents the mobility plotted against the temperature in degrees Kelvin.

Figure 4:
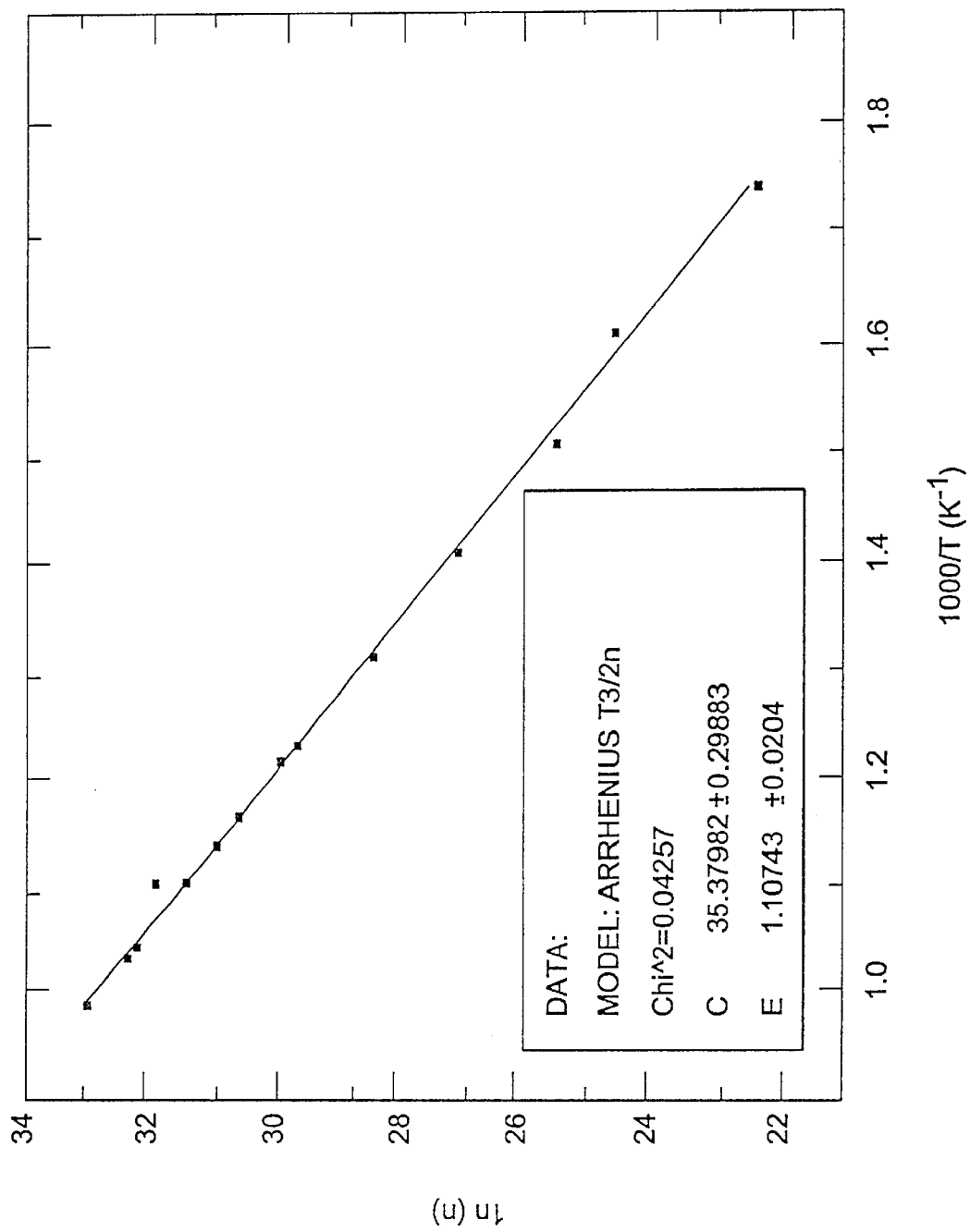
FIG. 4 is a plot of the natural log of the carrier concentration against the reciprocal temperature (degrees Kelvin) for semi-insulating silicon carbide according to the present invention.

FIG. 4 is a plot of the natural logarithm (ln) of the carrier concentration plotted against reciprocal temperature (degrees Kelvin). As known to those familiar with these measurements, the slope of the natural log of the carrier concentration against reciprocal temperature gives the activation energy. As indicated by the inset box in FIG. 4, the activation energy for this sample according to the invention is on the order of 1.1 eV, i.e., consistent with the results in FIG. 1. By comparison, and as likewise known to those familiar with semi-insulating silicon carbide, the activation energy for the semi-insulating silicon carbide when vanadium is used as the deep level trapping element would be about 1.6 eV under the same circumstances.

The data was measured under a magnetic field of 4 kilogauss on a sample thickness of 0.045 centimeters and over a temperature range from about 569 K to about 1,012 K.

Figure 5:
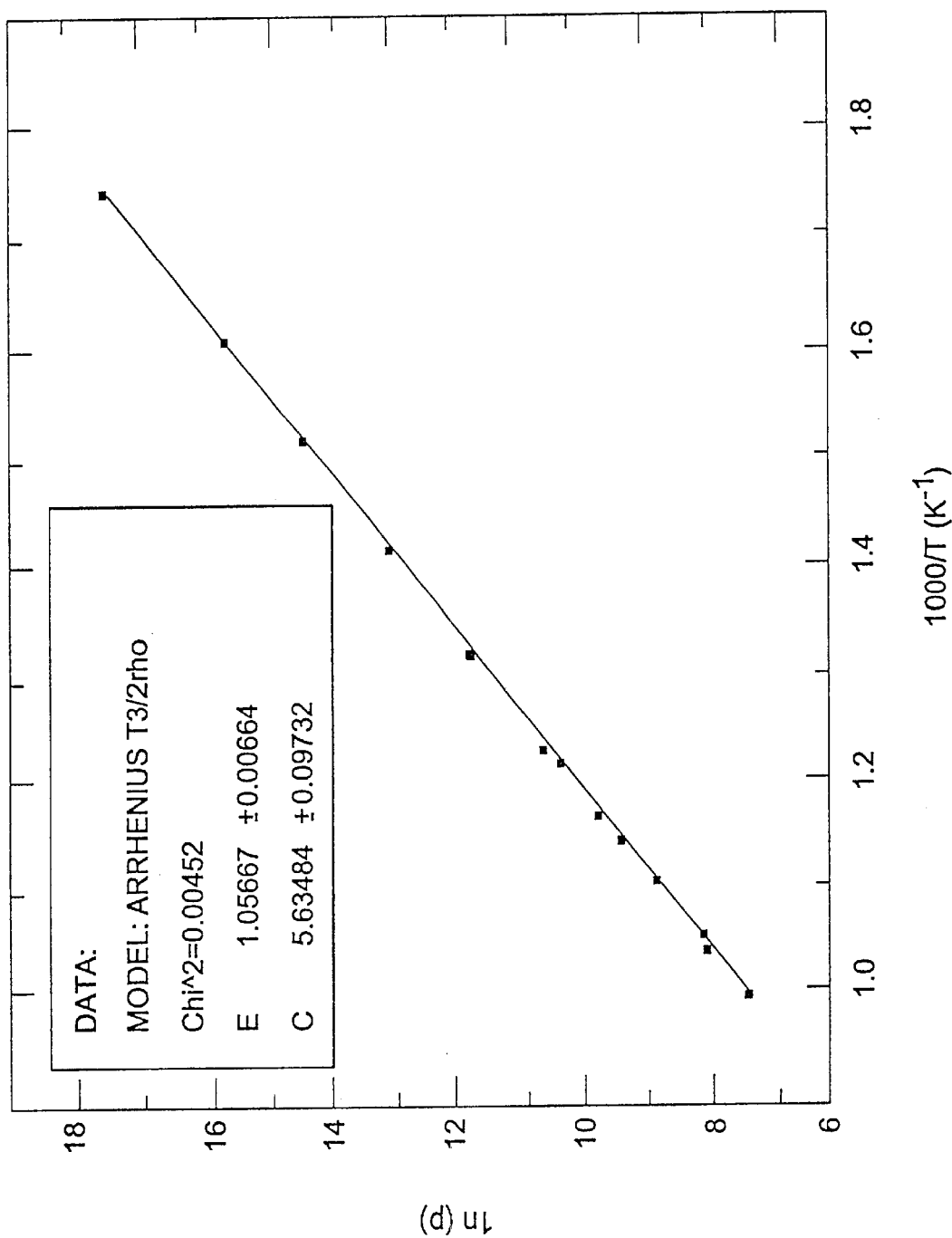
FIG. 5 is a plot of the natural log of the resistivity as against reciprocal temperature for semi-insulating silicon carbide according to the present invention.

FIG. 5 is a plot of the natural log of resistivity as against reciprocal temperature in degrees Kelvin. This data and this plot can likewise be used to determine the activation energy of the semi-insulating silicon carbide material. The value of 1.05667 eV determined from this plot helps confirm the 1.1 eV activation energy measured earlier. Stated differently, the difference between the activation energies as measured in FIGS. 4 and 5 is within expected experimental limits, and the data confirm each other.

Figure 6:
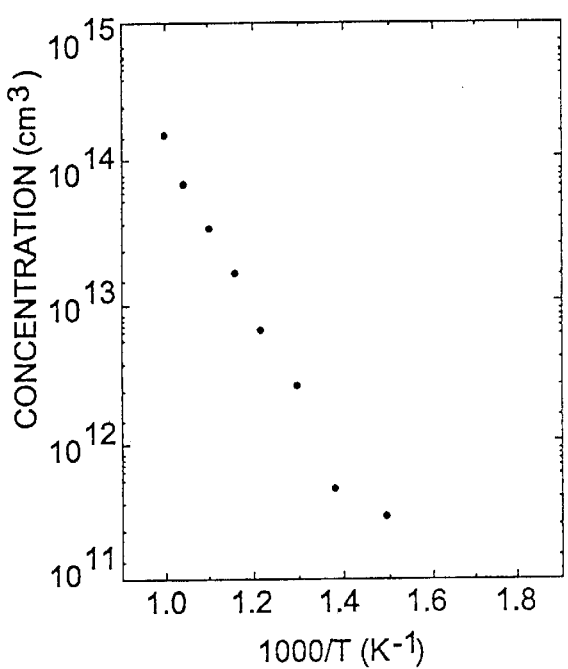
FIGS. 6 through 8 are the same measurements as represented in FIGS. 1 through 3, but taken from a different portion of the substrate wafer.
Figure 7:
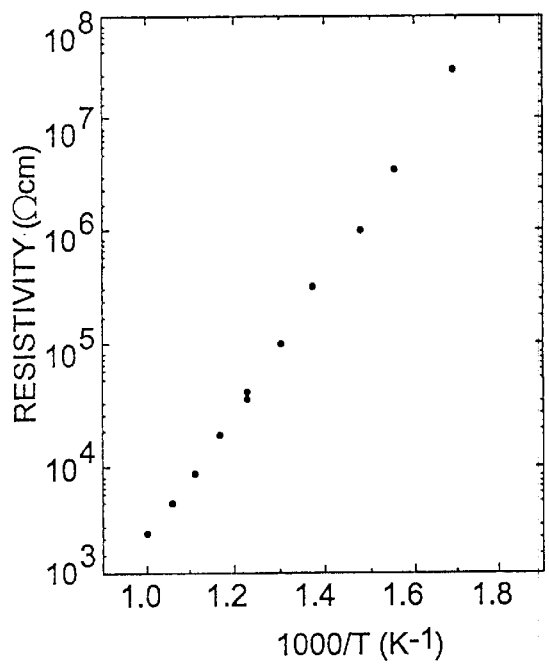
Figure 8:
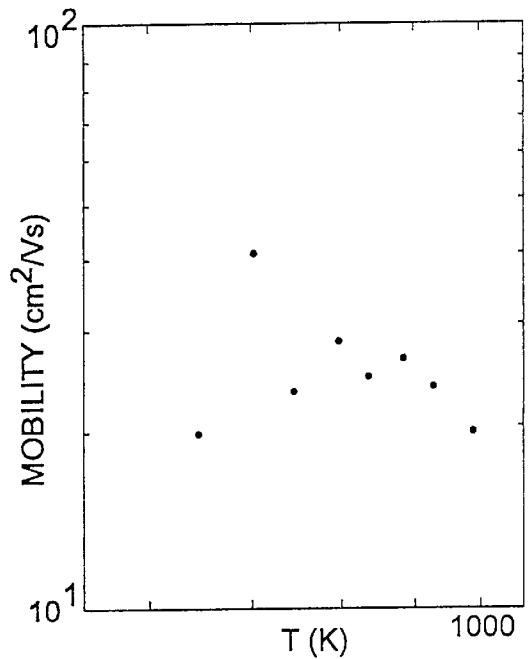
Figure 9:
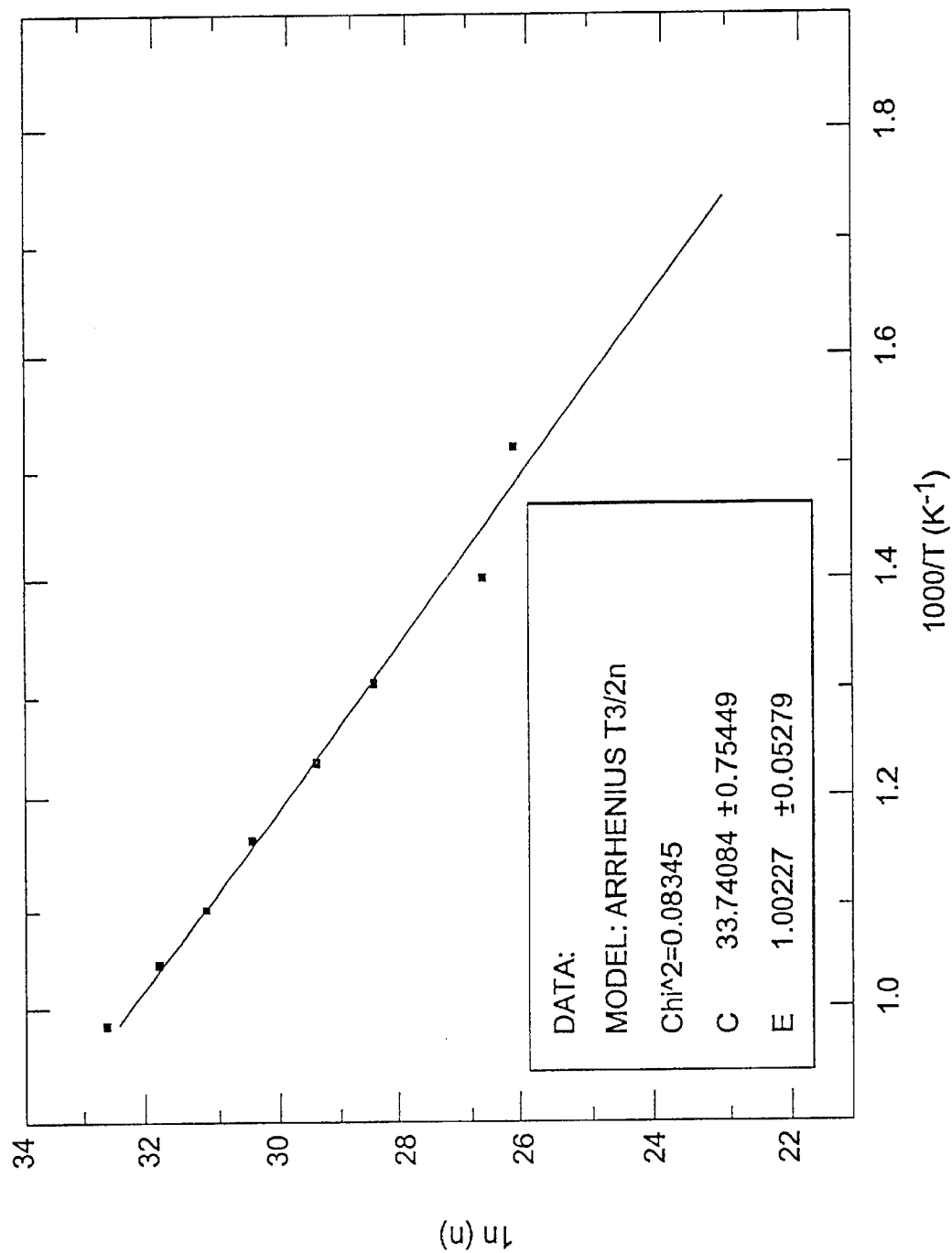
FIG. 9 is another plot of the natural log that carrier concentration versus reciprocal temperature for the samples illustrated in FIGS. 6 through 8.

FIGS. 6 through 10 represent the same types of measurements and plots as do FIGS. 1 through 5, but taken from a different sample; specifically a different area of the same wafer as that measured for FIGS. 1 through 5. It will accordingly be seen that FIGS. 6 through 8 are consistent with the results plotted in FIGS. 1 through 3. More specifically, FIG. 9, which is another plot of the natural log of carrier concentration against reciprocal temperature, shows a calculated activation energy of 1.00227 eV. Again, this is within experimental limits of the 1.1 eV measured earlier.

Figure 10:
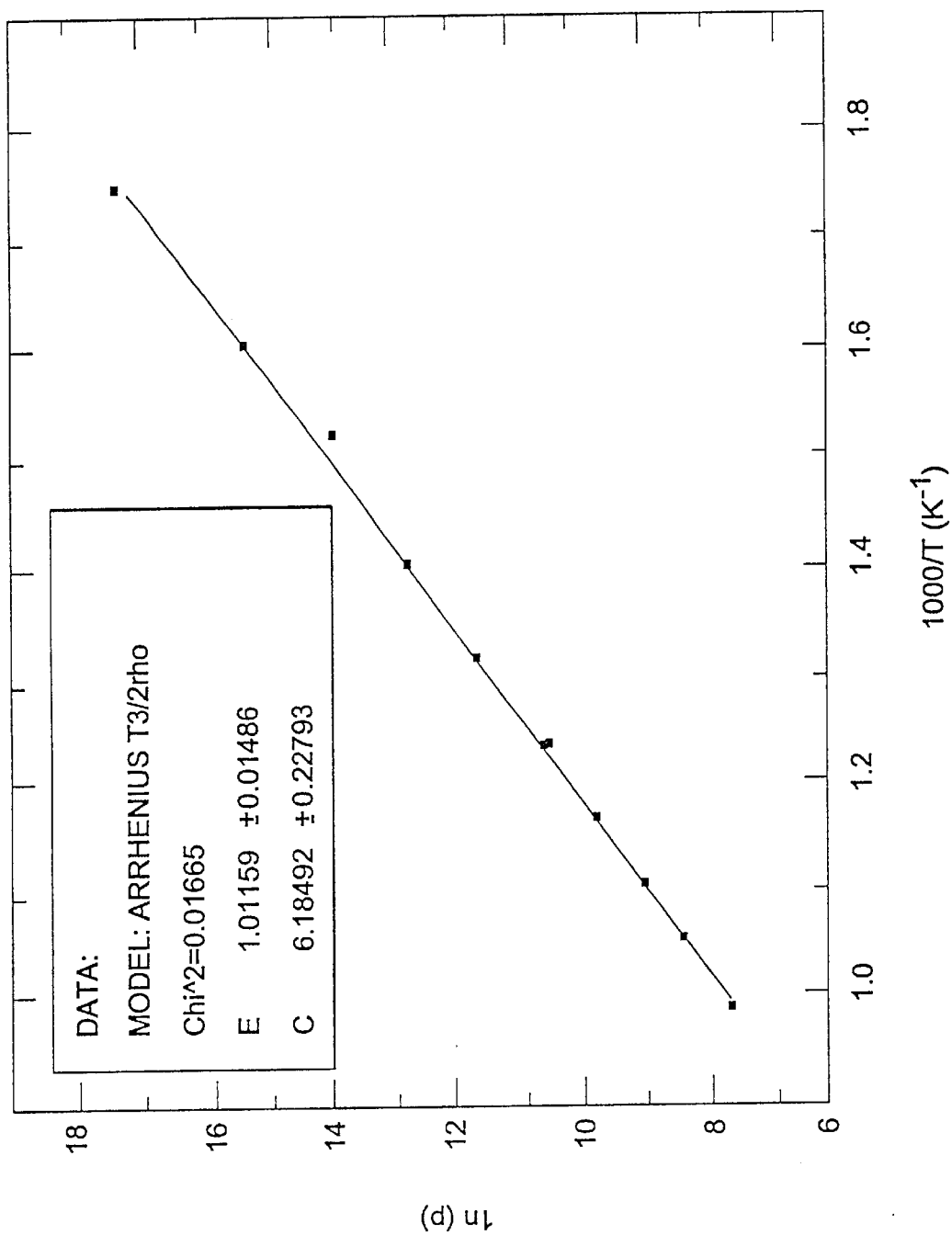
FIG. 10 is another plot of the natural log of resistivity versus reciprocal temperature and again corresponding to the sample measurements of FIGS. 6 through 8.
Figure 11:
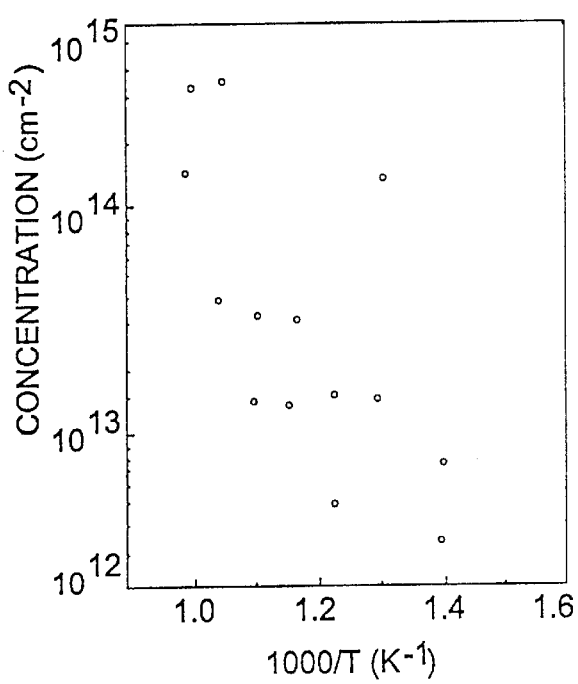
FIGS. 11 through 13 are yet another set of plots identical to FIGS. 1 through 3 and 6 through 8 for yet another measurement on a different portion of the semi-conducting silicon carbide material.
Figure 12:
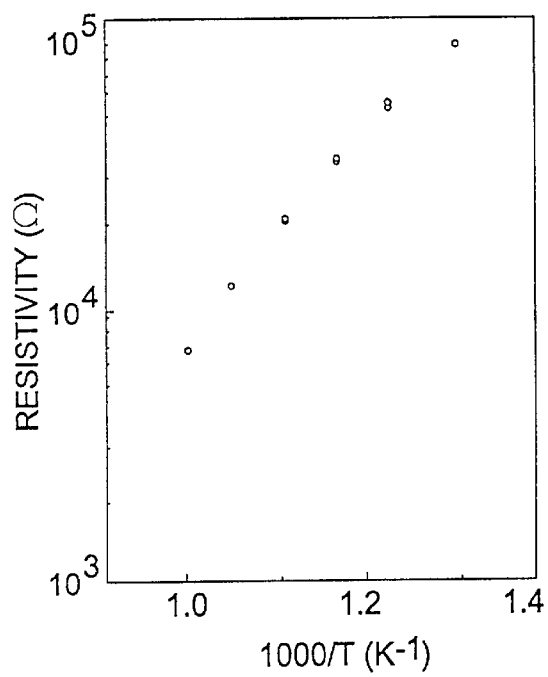
Figure 13:
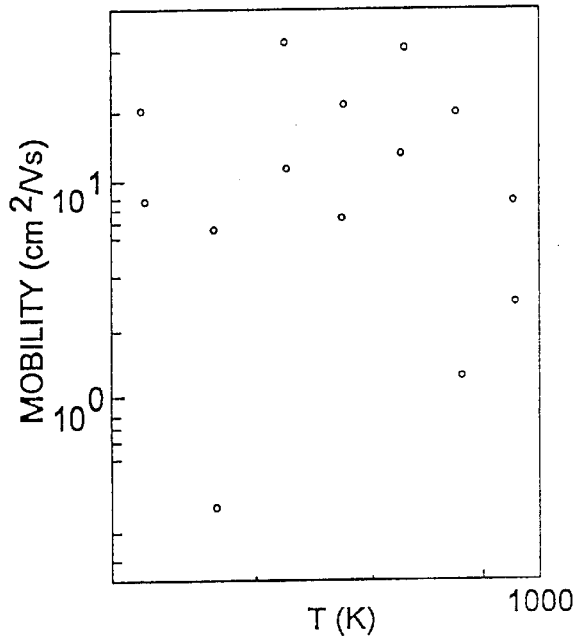
Figure 14:
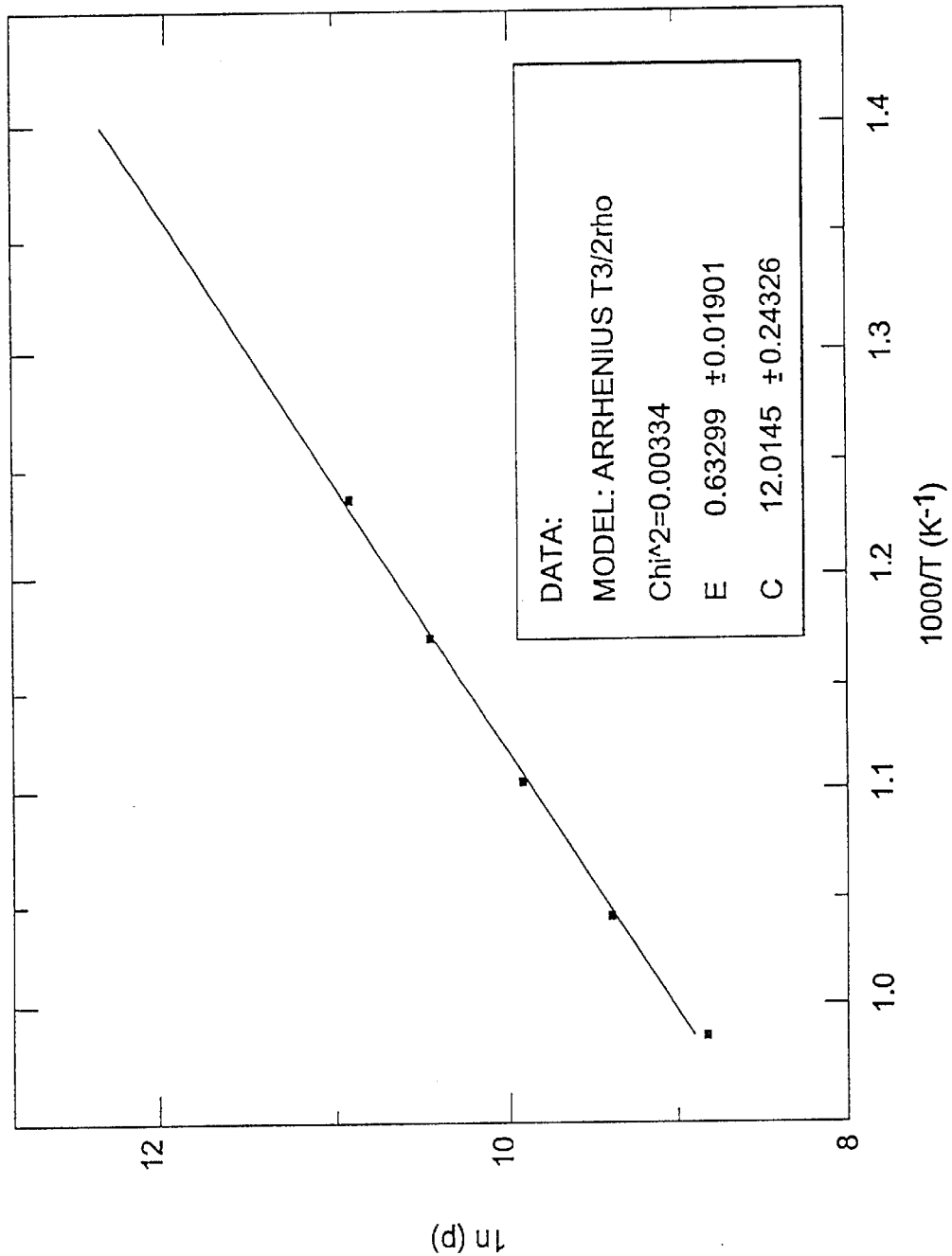
FIG. 14 is another plot of the natural log of resistivity as against reciprocal temperature for the samples illustrated in FIGS. 11 through 13.

In a similar manner, FIG. 10 plots the natural log of resistivity against the reciprocal temperature and similarly provides an activation energy of 1.01159, which likewise is within experimental limits of 1.1 eV. FIGS. 11 through 13 show results from yet another portion of the wafer, but which are considered less favorable than the results seen in the prior measurements. In particular, the plot of FIG. 11 fails to form a straight line in the manner desired, and the data is less favorable than were the earlier results. Similarly, FIG. 14, which plots the natural log of resistivity against reciprocal temperature shows a calculated activation energy of only 0.63299, a value well removed from 1.1 eV, regardless of the experimental uncertainty.

Figure 15:
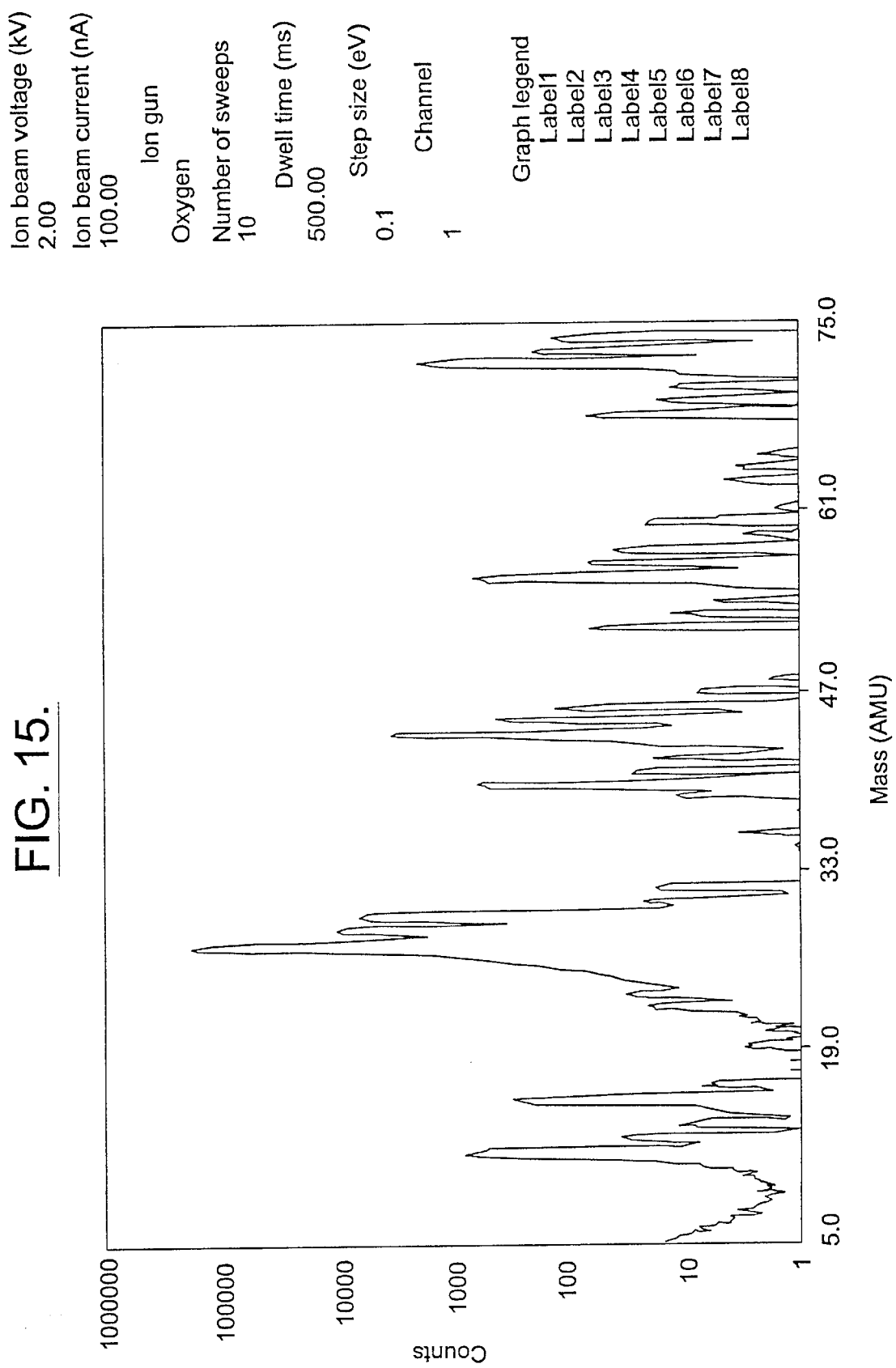
FIGS. 15, 16, and 17 are plots of Secondary Ion Mass Spectroscopy (SIMS) for various samples of materials according to the present invention and prior art material.
Figure 16:
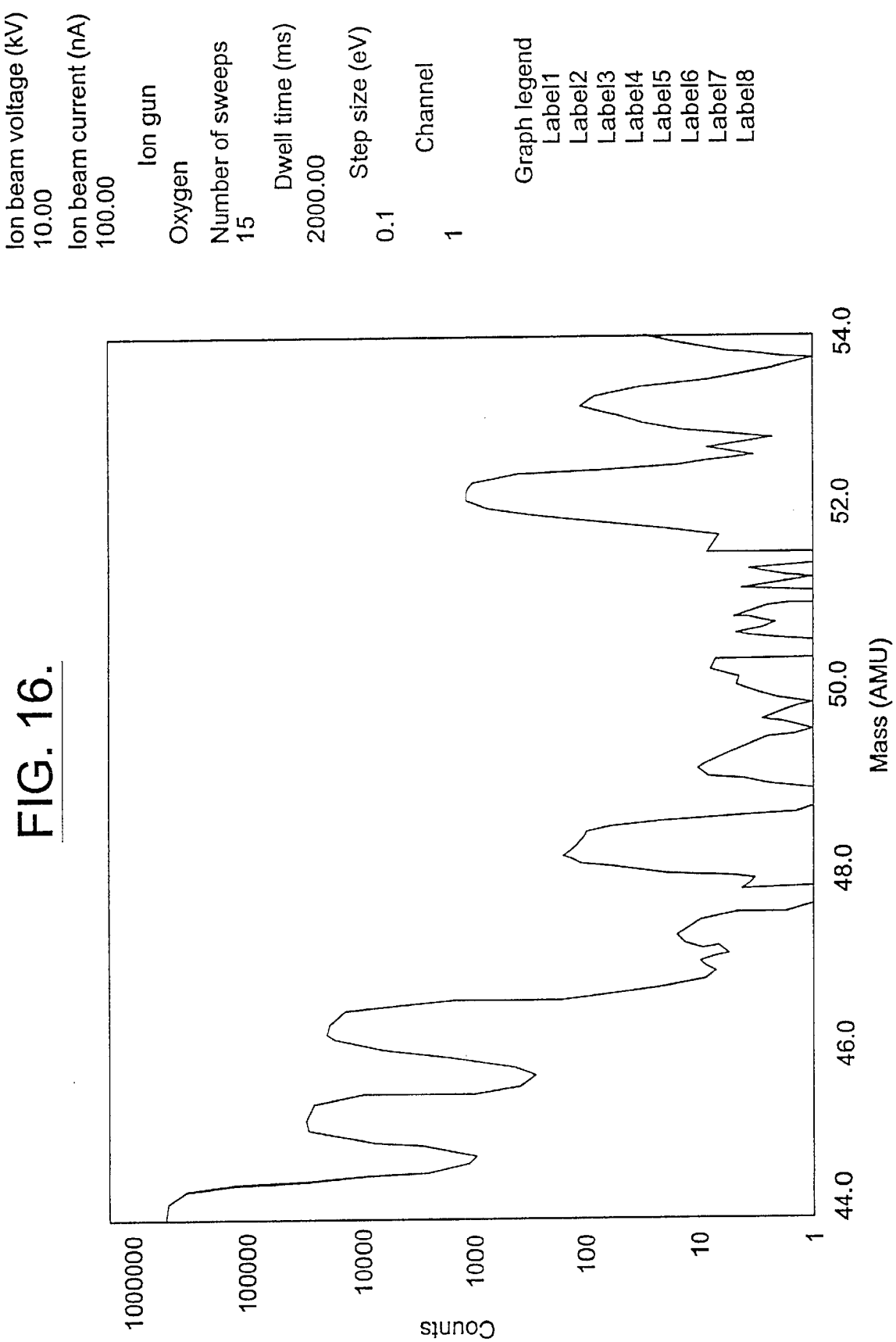
Figure 17:
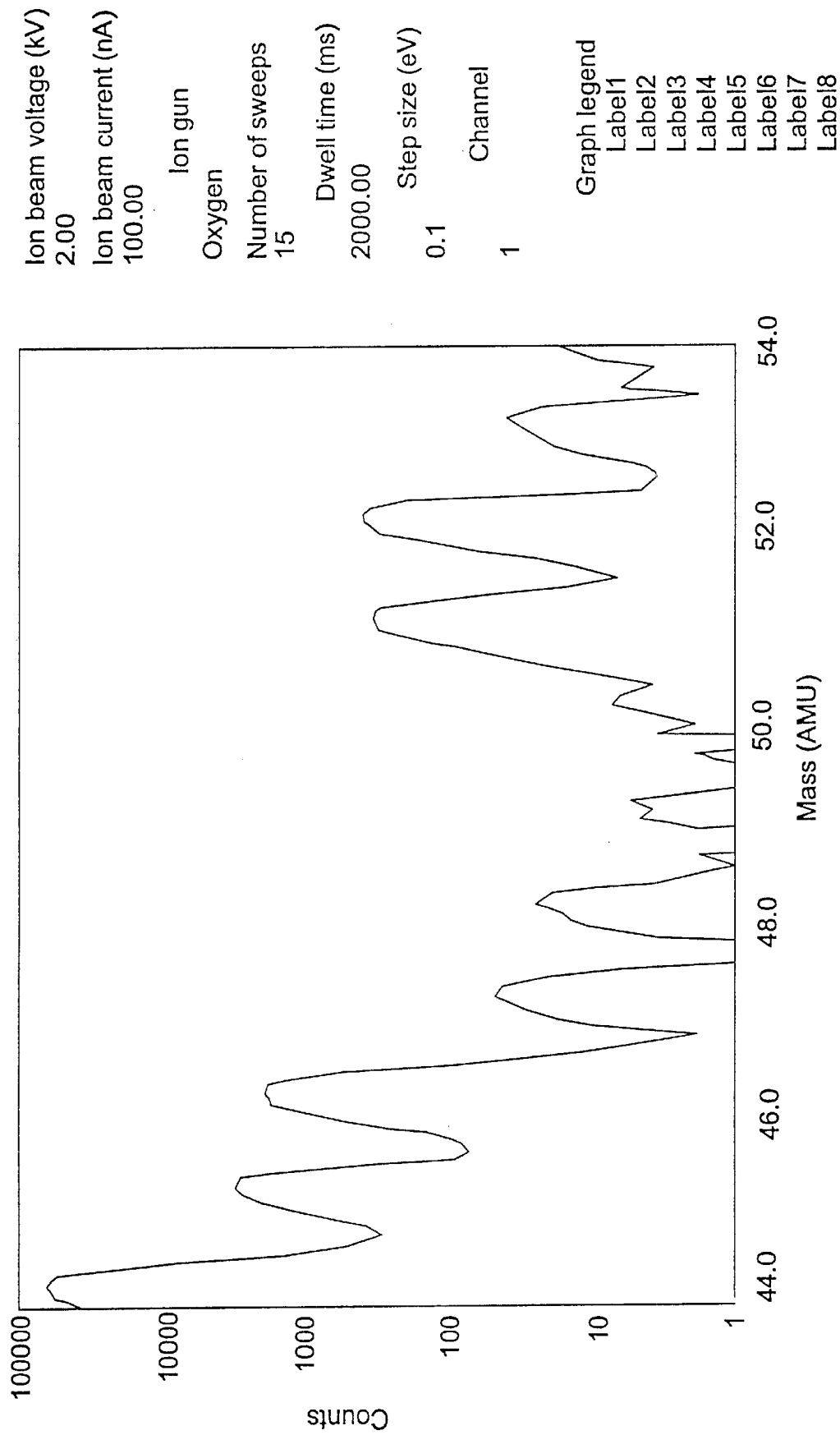

FIGS. 15, 16, and 17 represent the secondary ion mass spectra (SIMS) of various comparative samples and tend to show the elemental impurities and other materials in the semi-insulating silicon carbide substrates. FIG. 15 is the SIMS spectra of the semi-insulating silicon carbide material according to the present invention and confirms the absence of vanadium or any other transition metals in the sample. This confirms that the activation energy and deep level states present in the invention do not result from the presence of vanadium or other transition metals.

FIG. 16 is included for comparison purposes and is the SIMS spectrum of an N-type wafer of silicon carbide that is neither semi-insulating nor made according to the present invention, but instead represents a conductive silicon carbide sample. Because no reason exists to include vanadium for N-type substrates, vanadium is absent from the mass spectrum.

FIG. 17 provides a comparison of a prior version of semi-insulating silicon carbide which is compensated with vanadium. The vanadium peak is strongly present at approximately 51 atomic mass units in the spectrum. This vanadium peak is conspicuously absent from both FIGS. 15 and 16.

It will be understood, of course, by those familiar with these materials, that although the phrase "below detectable amounts," is an entirely appropriate description of the invention, these amounts can also be understood as those that are below the amount that affects the electronic characteristics, and particularly the resistivity, of the silicon carbide crystal.

Accordingly, in another aspect, the invention comprises a semi-insulating silicon carbide single crystal with shallow donor dopants, shallow acceptor dopants, and intrinsic point defects. In this aspect of the invention, the number of shallow donor dopants ($N_d$) in the silicon carbide crystal is greater than the number of shallow acceptor dopants ($N_a$), and the number of intrinsic point defects ($N_{di}$) in the silicon carbide that act as acceptors is greater than the numerical difference between the number of these donor and acceptor dopants. Further to this aspect, the concentration of elements selected from the group consisting of transition elements and heavy metals is less than the concentration that would affect the electrical properties of the silicon carbide single crystal. The resulting silicon carbide single crystal has a resistivity of at least 5000 Ω-cm at room temperature.

This aspect of the invention also applies to the complementary situation in which the number of acceptor dopant atoms is greater than the number of donor dopant atoms. In such a case, the number of intrinsic point defects that act as donors is greater than the numerical difference between the number of the shallow donor impurities and the shallow acceptor impurities.

Stated differently, the shallow n-type and p-type dopants compensate each other with one or the other predominating to a certain extent. The number of intrinsic point defects in the crystal that are electrically activated is greater than the net amount of n-type or p-type dopant atoms that predominate over the other in the crystal. Stated as a formula, $$N_{dt} > (N_d - N_a)$$

where donors predominate over acceptors, or $$N_{dt} > (N_a - N_d)$$

where acceptors predominate over donors. In the first case, the crystal would be compensated n-type based on dopant atoms. These net donors are compensated again, however, by acceptor-type point defects to produce the semi-insulating crystal. In the second case, the point defects act as donor type and compensate the net excess of acceptors in the crystal.

As used herein, the term "dopant" is used in a broad sense; i.e., to describe an atom other than silicon (Si) or carbon (C) present in the crystal lattice and providing either an extra electron (a donor) or an extra hole (an acceptor). In the invention, the dopants can be present either passively or proactively; i.e., the term "dopant" implies neither a "doping" step nor the absence of one.

It is expected that the number of point defects can be controlled to some extent by irradiating silicon carbide with neutrons, high energy electrons, or gamma rays to create the desired number of point defects to achieve the results consistent with the formulas set forth above.

Although an exact number of point defects is difficult to measure, techniques such as electron paramagnetic resonance (EPR), deep level transient spectroscopy (DLTS), and position annihilation spectroscopy give the best available indications of the numbers present. As further set forth herein, Hall effect measurements also confirm the desired characteristics of the crystal.

In another aspect, the invention can be incorporated into active devices, particularly active microwave devices, that take advantage of the semi-insulating silicon carbide substrate. As noted above and as recognized by those familiar with active semiconductor microwave devices, the frequency with which a microwave device can operate can be significantly hindered by any interaction of carriers with the substrate, as opposed to the ideal situation when the carriers are limited to a particular channel and other functional portions of the microwave device.

The nature of the silicon carbide semi-insulating material according to the present invention is such that it has excellent performance characteristics in the appropriate devices. These include, but are not limited to MESFETs, certain MOSFETS, and other devices such as those described in current U.S. patents and pending applications Nos. U.S. Pat. Nos. 5,270,554; 5,686,737; 5,719,409; 5,831,288; Ser. No. 08/891,221, filed Jul. 10, 1997; and Ser. No. 09/082,554, filed May 21, 1998, both for "Latch-up Free Power UMOS Bipolar Transistor"; Ser. No. 08/797,536, filed Feb. 7, 1997 for "Structure for Increasing the Maximum Voltage of Silicon Carbide Power Transistors"; Ser. No. 08/795,135, filed Feb. 7, 1997 for "Structure to Reduce the On-resistance of Power Transistors"; and International Application. No. PCT/US98/13003, filed Jun. 23, 1998 (designating the United States), for "Power Devices in Wide Bandgap Semiconductors"; the contents of all of which are incorporated entirely herein by reference.

Experimental

Two wafers of semi-insulating SiC were examined at the Air Force Research Laboratory at Dayton, Ohio (Wright-Patterson Air Force Base), with high temperature Hall effect and SIMS. No understandable results were available from one of the wafers (possibly because of unsatisfactory ohmic contacts), but two Hall samples from the second wafer both gave the same results, giving a reasonable confidence level in those results.

Both wafers were insulating at room temperature. The measurable wafer was thermally activated at elevated temperatures and the carrier concentration was measurable, which is not always possible in semi-insulating material because of the low mobilities due to the high temperatures involved. The carrier concentration was around $10^{15}$ cm$^{-3}$ at 1000 K where the resistivity was about 103 Ω-cm. Such carrier concentration is about one to two orders of magnitude lower than that seen in conventional semi-insulating material or vanadium doped material at the same temperature. No fit of the n vs 1/T curve could be made, however, so the total concentration for the active layer remained unavailable. The activation energy was around 1.1 eV.

SIMS was carried out on the sample with a high resolution system. Nothing was seen other than some copper near the detection limit along with some hydrogen, which was surmised from the height of the mass 47 peak. The mass 47 peak was accordingly attributed to SiOH. The mass scan for the invention along with the scans for two comparative samples are included herewith as FIGS. 18–20, respectively. Titanium (Ti) is apparent at around $1 \times 10^{16}$ cm$^{-3}$ in FIGS. 19 and 20, but not in the sample of the invention (FIG. 18). Vanadium also appears in the standard semi-insulating sample (FIG. 20) along with the SiOH line indicating hydrogen.

From these results, the first wafer was considered to be very high purity material, and is considered insulating because any residual vanadium impurities along with what other defect makes up the 1.1 eV level are present in concentrations larger than the sum of the shallow impurities and so the 1.1 eV levels compensates the shallow impurities. The Fermi level is pinned at the deep level, thus making the material semi-insulating. The presence of hydrogen, if any, could mean that hydrogen compensation is taking place, but such would not be expected to selectively compensate or neutralize the shallow impurities and not the deep levels.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. A semi-insulating bulk single crystal of silicon carbide having a resistivity of at least 5000 Ω-cm at room temperature and a concentration of deep level trapping elements that is below $1 \times 10^{16}$ cm$^{-3}$ and a concentration of nitrogen atoms below $1 \times 10^{17}$ cm$^{-3}$.

2. A semi-insulating bulk single crystal of silicon carbide according to claim 1 wherein concentration of nitrogen is $5 \times 10^{16}$ cm$^{-3}$ or less.

3. A semi-insulating bulk single crystal of silicon carbide having a resistivity of at least 5000 Ω-cm at room temperature and a concentration of deep level trapping elements that is below $1\times10^{16}$ cm$^{-3}$ and the concentration of vanadium is less than $1\times10^{16}$ cm$^{-3}$.

4. A silicon carbide single crystal according to claim 3 wherein the concentration of vanadium is less than $1\times10^{14}$ cm$^{-3}$.

5. A semi-insulating bulk single crystal of silicon carbide having a resistivity of at least 50,000 Ω-cm at room temperature and a concentration of deep level trapping elements that is below $1\times10^{16}$ cm$^{-3}$.

* * * * *